(12) United States Patent
Yan et al.

(10) Patent No.: US 11,075,256 B2
(45) Date of Patent: Jul. 27, 2021

(54) DISPLAY PANEL HAVING FINGERPRINT RECOGNITION FUNCTION, MANUFACTURING METHOD AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Jun Yan, Beijing (CN); Yulong Wei, Beijing (CN); Xiangdan Dong, Beijing (CN); Sang won Lee, Beijing (CN); Tingliang Liu, Beijing (CN); Yuan Yao, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 18 days.

(21) Appl. No.: 16/612,599

(22) PCT Filed: Feb. 22, 2019

(86) PCT No.: PCT/CN2019/075949
§ 371 (c)(1),
(2) Date: Nov. 11, 2019

(87) PCT Pub. No.: WO2020/007052
PCT Pub. Date: Jan. 9, 2020

(65) Prior Publication Data
US 2021/0074787 A1    Mar. 11, 2021

(30) Foreign Application Priority Data
Jul. 2, 2018  (CN) .......................... 201810737154.7

(51) Int. Cl.
H01L 27/32     (2006.01)
G06K 9/00      (2006.01)
H01L 51/56     (2006.01)

(52) U.S. Cl.
CPC ........ H01L 27/3272 (2013.01); G06K 9/0004 (2013.01); H01L 27/3227 (2013.01); H01L 51/56 (2013.01)

(58) Field of Classification Search
None
See application file for complete search history.

(56) References Cited

U.S. PATENT DOCUMENTS 10,825,875 B2 * 11/2020 Zhao ................... H01L 51/5284
2018/0011564 A1   1/2018 Aurongzeb et al.
(Continued)

FOREIGN PATENT DOCUMENTS

CN    105373772 A    3/2016
CN    106293229 A    1/2017
(Continued)

OTHER PUBLICATIONS

Chinese Office Action dated Jul. 8, 2019, from application No. 201810737154.7.
(Continued)

*Primary Examiner* — J. E. Schoenholtz
(74) *Attorney, Agent, or Firm* — Arch & Lake LLP (57) ABSTRACT

The present disclosure provides a display panel, including a metal light shielding layer having a first spacing area, an electrode layer having a second spacing area, and an insulating layer having a recessed area. The second spacing area is disposed offset from the first spacing area; and an insulating layer is disposed between the metal light shielding layer and the electrode layer. An orthographic projection of the recessed area on the metal light shielding layer is at least (Continued)

partially located between a first boundary and a second boundary. The first boundary is an orthographic projection of a sidewall of the first spacing area away from the second spacing area on the metal light shielding layer, and the second boundary is an orthographic projection of a sidewall of the second spacing area away from the first spacing area on the metal light shielding layer.

17 Claims, 7 Drawing Sheets

(56) References Cited

U.S. PATENT DOCUMENTS

| 2018/0188839 | A1 | 7/2018 | Wang et al. |
| 2019/0050621 | A1 | 2/2019 | Xu et al. |

FOREIGN PATENT DOCUMENTS

| CN | 106502473 | A | 3/2017 |
| CN | 106886767 | A | 6/2017 |
| CN | 107248518 | A | 10/2017 |
| CN | 107590423 | A | 1/2018 |
| CN | 107871757 | A | 4/2018 |
| CN | 107977632 | A | 5/2018 |
| CN | 108898946 | A | 11/2018 |
| JP | WO2017-168823 | A1 | 2/2019 |
| KR | 20180062305 | A | 6/2018 |
| WO | WO-2006/051440 | A1 | 5/2006 |
| WO | WO-2017/168823 | A1 | 10/2017 |
| WO | WO-2018/006477 | A1 | 1/2018 |
| WO | WO-2018/214799 | A1 | 11/2018 |

OTHER PUBLICATIONS

International Search Report and Written Opinion dated Jun. 3, 2019, from application No. PCT/CN2019/075949.

* cited by examiner

DISPLAY PANEL HAVING FINGERPRINT RECOGNITION FUNCTION, MANUFACTURING METHOD AND DISPLAY DEVICE

CROSS REFERENCE TO RELATED APPLICATIONS

The present application is based upon International Application No. PCT/CN2019/075949, filed on Feb. 22, 2019, which claims the priority of Chinese Patent Application No. 201810737154.7, filed on Jul. 2, 2018, the entire disclosure of which is hereby incorporated by reference.

TECHNICAL FIELD

The present disclosure relates to the field of display technologies, in particular, relates to a display panel having a fingerprint recognition function, a manufacturing method of the same, and a display device mounted with a display panel having a fingerprint recognition function.

BACKGROUND

With rapid development of full-screen mobile phones, research on under-screen fingerprint recognition has received extensive attention. The principle of aperture imaging has been used to perform fingerprint recognition under the screen.

The above information disclosed in the Background section is only for enhancement of understanding of the background of the present disclosure, and thus it may include information that does not constitute a prior art known to those of ordinary skill in the art.

SUMMARY

The disclosure is directed to a display panel having a fingerprint recognition function, a manufacturing method of the display panel, and a display device mounted with the display panel having the fingerprint recognition function.

Additional aspects of the present disclosure in part will be set forth in the description which follows, and in part will become apparent from the description, or maybe learned by practice of the present disclosure.

According to an aspect of the present disclosure, there is provided a display panel having a fingerprint recognition function. The display panel includes a metal light shielding layer with a first spacing area. The display panel includes an electrode layer with a second spacing area. The second spacing area is disposed offset from the first spacing area. The display panel includes an insulating layer disposed between the metal light shielding layer and the electrode layer. The insulating layer is disposed with a recessed area. An orthographic projection of the recessed area on the metal light shielding layer is at least partially located between a first boundary and a second boundary. The first boundary is an orthographic projection of a sidewall of the first spacing area away from the second spacing area on the metal light shielding layer, and the second boundary is an orthographic projection of a sidewall of the second spacing area away from the first spacing area on the metal light shielding layer.

In an example arrangement of the present disclosure, an orthographic projection of the recessed area on the metal light shielding layer and an orthographic projection of the first spacing area on the metal light shielding layer partially overlap with each other. The recessed area is covered with the electrode layer.

In an example arrangement of the present disclosure, an orthographic projection of the recessed area on the metal light shielding layer and an orthographic projection of the second spacing area on the metal light shielding layer partially overlap with each other. A sidewall of the recessed area adjacent to the first spacing area is covered with the electrode layer.

In an example arrangement of the present disclosure, an orthographic projection of the recessed area on the metal light shielding layer and an orthographic projection of the second spacing area on the metal light shielding layer partially overlap with each other. A sidewall of the recessed area adjacent to the first spacing area is covered with the electrode layer, and the electrode layer extends to cover at least a part of the bottom wall of the recessed area.

In an example arrangement of the present disclosure, the thickness of the insulating layer in the recessed area is greater than or equal to 500 angstroms and less than or equal to 1 micrometer.

In an example arrangement of the present disclosure, the insulating layer includes a first insulating layer disposed on the metal light shielding layer. The insulating layer includes a second insulating layer disposed between the first insulating layer and the electrode layer, and disposed with a via to form the recessed area.

In an example arrangement of the present disclosure, an orthographic projection of the recessed area on the metal light shielding layer is located within an orthographic projection of the first spacing area on the metal light shielding layer.

According to an aspect of the present disclosure, there is provided a display device including a display panel having a fingerprint recognition function as described in any of the above arrangements.

According to an aspect of the present disclosure, there is provided a manufacturing method of a display panel having a fingerprint recognition function. The manufacturing method includes forming a metal light shielding layer, and forming a first spacing area in the metal light shielding layer. The manufacturing method includes forming an insulating layer over the metal light shielding layer and forming a recessed area in the insulating layer. The manufacturing method includes forming an electrode layer over the insulating layer and forming a second spacing area in the electrode layer. An orthographic projection of the recessed area on the metal light shielding layer is at least partially located between a first boundary and a second boundary. The first boundary is an orthographic projection of a sidewall of the first spacing area away from the second spacing area on the metal light shielding layer, and the second boundary is an orthographic projection of a sidewall of the second spacing area away from the first spacing area on the metal light shielding layer.

In an example arrangement of the present disclosure, forming a recessed area on the insulating layer includes: coating a photoresist layer on the insulating layer; laying a halftone mask over the photoresist layer such that a semi-transmissive area of the halftone mask is located at a position where the recessed area is to be formed; illuminating the halftone mask; removing the halftone mask, developing the photoresist layer to form a step shape on the photoresist layer, and etching the exposed insulating layer to form a blind hole; performing ashing treatment on the photoresist layer to expose the insulating layer at the position where the recessed area is to be formed; and etching the exposed insulating layer to form the recessed area and the via.

In an example arrangement of the present disclosure, forming an insulating layer over the metal light shielding layer and forming a recessed area on the insulating layer includes: forming a first insulating layer over the metal light shielding layer; forming a second insulating layer over the first insulating layer; and etching the second insulating layer to form the recessed area.

DETAILED DESCRIPTION

Example arrangements will now be described more fully with reference to the accompanying drawings. However, the example arrangements can be embodied in a variety of forms and should not be construed as being limited to the arrangements set forth herein. Rather, these arrangements are provided to make the present disclosure more thorough and complete, and to fully convey the concept of the example arrangements to those skilled in the art. In the figures, the same reference numerals in the drawings denote the same or similar structures, and thus their detailed description will be omitted.

Figure 1:
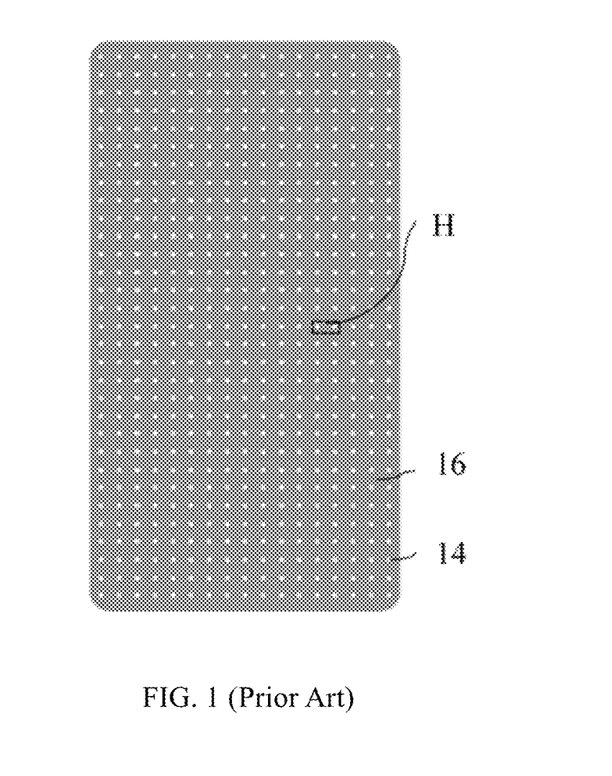
FIG. 1 is a schematic structural diagram of an integrated aperture array in a display panel in an example of the present disclosure.
Figure 2:
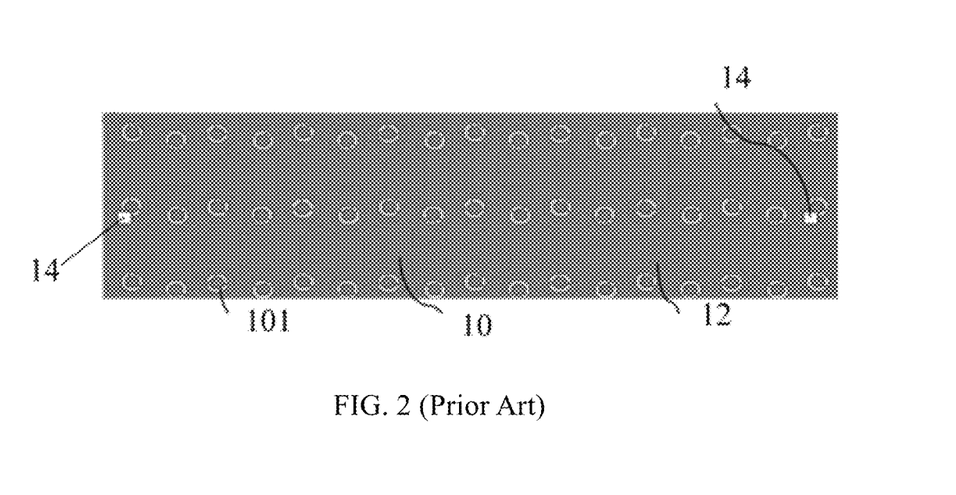
FIG. 2 is a partially enlarged schematic diagram showing the portion H of FIG. 1.

Referring to an example of the present disclosure shown in FIG. 1 and FIG. 2, a schematic structural diagram of integrating an aperture imaging array in a display panel is shown. In the figure, a square area is an imaging aperture 14, an annular area is a first spacing area 101, and a fingerprint is imaged onto a photoelectric sensor by utilizing the principle of aperture imaging in the display area 16, and finally, recognition is successfully performed.

Figure 3:
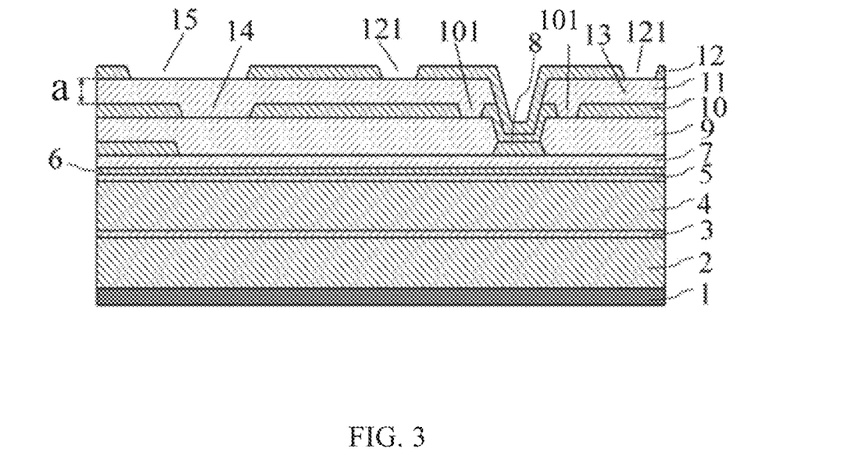
FIG. 3 is a schematic structural diagram of a display panel in an example of the present disclosure.

Referring to the structural diagram of the display panel in an example of the present disclosure shown in FIG. 3. At present, an imaging aperture 14 is disposed on a metal light shielding layer 10, and a via hole 15 corresponding to the imaging aperture 14 is disposed on an electrode layer 12, such that reflected light of the fingerprint can be imaged through the via hole 15 and imaged through the imaging aperture 14 to the photoelectric sensor to implement fingerprint recognition. In order to avoid electrical connection between the metal light shielding layer 10 and the electrode layer 12, a first spacing area 101 on the metal light shielding layer 10 is required. In order to separate the electrodes of the respective pixels, a second spacing area 121 is disposed on the electrode layer 12. In order to prevent stray light from being incident on the photoelectric sensor through the second spacing area 121 and the first spacing area 101, the second spacing area 121 is disposed offset from the first spacing area 101, such that the first spacing area 101 is blocked by the electrode layer 12 to avoid stray light to be incident to the first spacing area 101. It also can realize that the second spacing area 121 is blocked by the metal light shielding layer 10 to prevent stray light from being directly incident on the first spacing area 101 from the second spacing area 121. The remaining positions are shielded from light by both of the metal light shielding layer 10 and the electrode layer 12.

Figure 4:
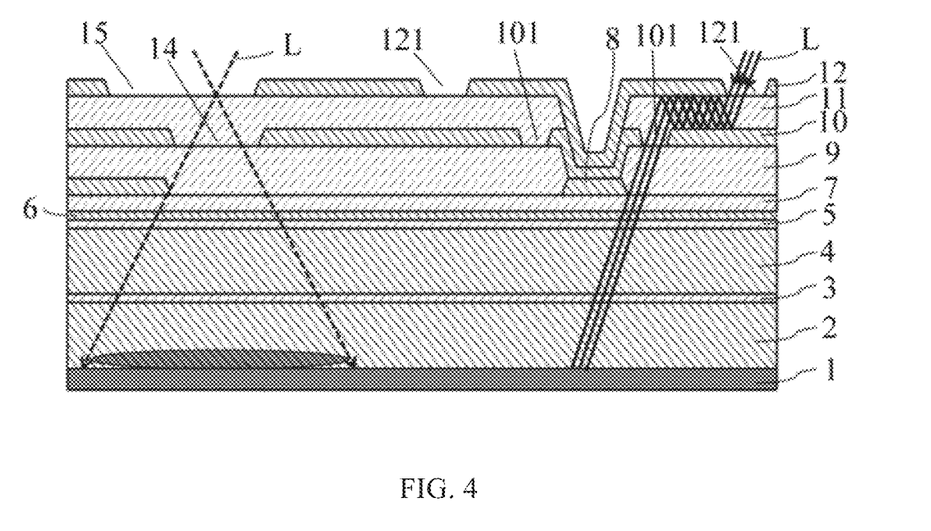
FIG. 4 is a schematic diagram of a light leakage effect of a display panel in an example of the present disclosure.

Referring to an example of the present disclosure in FIG. 4, the light leakage effect of the display panel is shown. However, an insulating layer 11 is disposed between the metal light shielding layer 10 and the electrode layer 12, in order to reduce a coupling capacitance between the electrode layer 12 and the metal light shielding layer 10. The insulating layer 11 needs to be disposed thicker, and the insulating layer 11 between the metal light shielding layer 10 and the electrode layer 12 forms a light leakage port 13, resulting in a large amount of stray light passing through the second spacing area 121 to be incident to the light leakage port 13 of the insulating layer. The stray light is reflected for many times in the insulating layer 11 and then is incident to the first spacing area 101, and finally incident to the photoelectric sensor layer 1 to form a noise, resulting in low contrast during fingerprint acquisition, blurred fingerprint image, and poor fingerprint recognition effect.

The present disclosure first provides a display panel having a fingerprint recognition function, which may include a metal light shielding layer 10, an electrode layer 12, and an insulating layer 11. A first spacing area 101 is disposed on the metal light shielding layer 10; a second spacing area 121 is disposed on the electrode layer 12; and the second spacing area 121 is disposed offset from the first spacing area 101. The insulating layer 11 is disposed between the metal light shielding layer 10 and the electrode layer 12, and the insulating layer 11 is disposed with a recessed area 111. An orthographic projection of the recessed area on the metal light shielding layer is at least partially located between a first boundary that is an orthographic projection of a sidewall of the first spacing area away from the second spacing area on the metal light shielding layer and a second boundary that is an orthographic projection of a sidewall of the second spacing area away from the first spacing area on the metal light shielding layer, so as to reduce the size of the light leakage port between the metal light shielding layer 10 and the electrode layer 12.

It should be noted that the sidewall is an outer contour of the first spacing area or the second spacing area. In this arrangement, the first spacing area or the second spacing area is of a circular shape, and the sidewall of the first spacing area away from the second spacing area mentioned above is a point on the outer contour of the first spacing area that has the largest distance from the second spacing area.

It should be understood that the shape of the first spacing area or the second spacing area is not limited thereto, and may also be a polygon, and the shape of the recessed area may be a circle, a polygon, or an irregular shape.

The display panel may further include a photoelectric sensor layer 1, a first flexible film layer 2, a first barrier layer 3, a second flexible film layer 4, a second barrier layer 5, a buffer layer 6, a dielectric layer 7, a source-drain layer 8 and a planarization layer 9 disposed in this order from bottom to top. A metal light shielding layer 10 is provided over the planarization layer 9, an insulating layer 11 is provided over the metal light shielding layer 10, and an electrode layer 12 is provided over the insulating layer 11.

Specifically, the source-drain layer 8 is disposed over the dielectric layer 7. The planarization layer 9 is provided over the source-drain layer 8, and a via through which the metal light shielding layer 10 and the source-drain layer 8 are connected is provided over the planarization layer 9. The metal light shielding layer 10 is disposed over the planarization layer 9, and the metal light shielding layer 10 is connected to the source-drain layer 8 through the via. The first spacing area 101 is provided around the periphery of the connection portion of the metal light shielding layer 10 with the source-drain layer 8. The insulating layer 11 is disposed over the metal light shielding layer 10, and a via is also disposed on the insulating layer 11. The via is disposed aligned with the via provided on the planarization layer 9. The electrode layer 12 is disposed over the insulating layer 11, and the electrode layer 12 may be connected to the metal light shielding layer 10 and the source-drain layer 8 through the via on the insulating layer 11 to form a connection portion. The second spacing area 121 is disposed on the electrode layer 12 and the second spacing area 121 is located on the side of the first spacing area 101 that is away from the connection portion.

The second spacing area 121 is disposed offset from the first spacing area 101. Therefore, the orthographic projection of the second spacing area 121 on the metal light shielding layer 10 is spaced apart from the orthographic projection of the first spacing area 101 on the metal light shielding layer 10. For convenience of description, the orthographic projection of the first spacing area 101 on the metal light shielding layer 10 is referred to as a first area, and the orthographic projection of the second spacing area 121 on the metal light shielding layer 10 is referred to as a second area, and the spacing between them is referred to as a spacing area.

The display panel having a fingerprint recognition function of the present disclosure will be described in detail below through three example arrangements.

Example Arrangement 1

Figure 5:
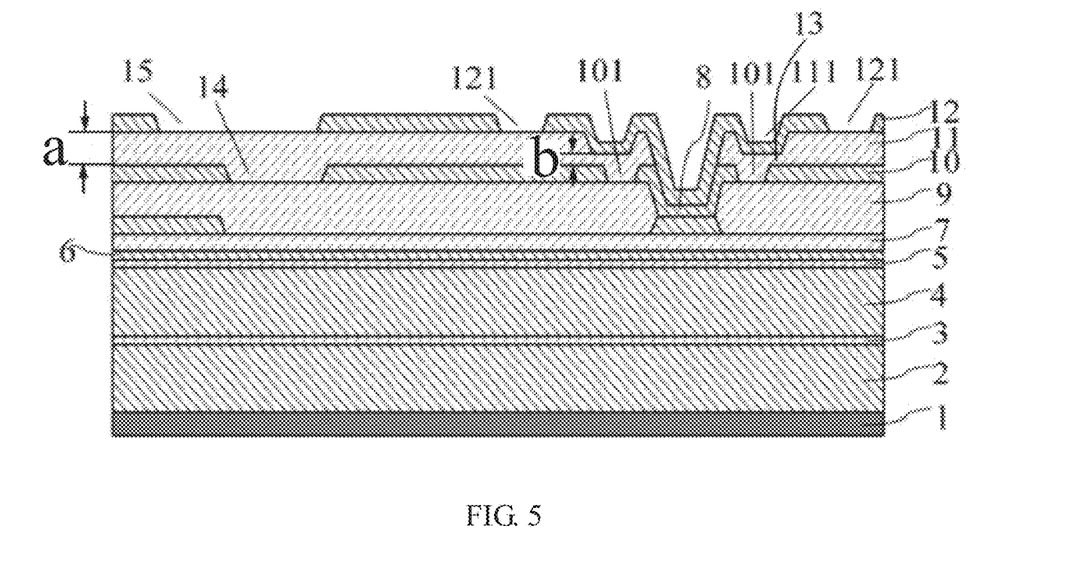
FIG. 5 is a schematic structural diagram of an example arrangement of a display panel having a fingerprint recognition function according to the present disclosure.

Referring to FIG. 5, a schematic structural diagram of an example arrangement of a display panel having a fingerprint recognition function of the present disclosure is shown. An orthographic projection of the recessed area 111 on the metal light shielding layer 10 and the orthographic projection of the first spacing area 101 on the metal light shielding layer 10 partially overlap, and the position of the recessed area 111 is adjacent to the first spacing area 101. The orthographic projection of the recessed area 111 on the metal light shielding layer 10 occupies a portion of the first area and a portion of the spacing area. Specifically, the sidewall of the recessed area 111 away from the second spacing area 121 (or adjacent to the connecting portion) is located between the two sidewalls of the first spacing area 101, and the sidewall of the recessed area 111 adjacent to the second spacing area 121 (or away from the connection) is located between a side wall of the first spacing area 101 adjacent to the second spacing area 121 (or away from the connecting portion) and a sidewall of the second spacing area 121 adjacent to the first spacing area 101 (or closed to the connecting portion). The light leakage port 13 formed between the electrode layer 12 of the bottom wall of the recessed area 111 and the metal light shielding layer 10 can be reduced.

In addition, in other example arrangements of the present disclosure, the orthographic projection of the recessed area 111 on the metal light shielding layer 10 is located within the orthographic projection of the first spacing area 101 on the metal light shielding layer 10. That is, the orthographic projection of the recessed area 111 on the metal light shielding layer 10 may occupy only a portion of the first area without occupying the spacing area and the second area, and can also reduce the light leakage port 13 formed between the electrode layer 12 of the bottom wall of the recessed area 111 and the metal light shielding layer 10. In this case, the electrode layer 12 covered over the recessed area 111 does not generate capacitance with the metal light shielding layer 10. Also, the orthographic projection of the recessed area 111 on the metal light shielding layer 10 may occupy a portion of the first area without occupying the spacing area and the second area, and has the same edge line as the edge line of the first area adjacent to the second area. That is, the side wall of the recessed area 111 adjacent to the second spacing area 121 (or away from the connecting portion) may be in the same plane as the side wall of the first spacing area 101 adjacent to the second spacing area 121 (or away from the connecting portion). Similarly, the light leakage port 13 formed between the electrode layer 12 of the bottom wall of the recessed area 111 and the metal light shielding layer 10 can be reduced.

In the present example arrangement, the recessed area 111 is covered with the electrode layer 12. The electrode layer 12 can block stray light, and prevent stray light from being emitted from the recessed area 111 to the first spacing area 101, and finally to the photoelectric sensor.

The stray light that is incident to the insulating layer 11 through the second spacing area 121, after being reflected for many times in the insulating layer 11, has the amount of light incident on the first spacing area 101 reduced due to the reduced size of the light leakage port 13. Thus, the amount of stray light incident to the photoelectric sensor can be reduced, the fingerprint acquisition contrast can be higher, the obtained fingerprint image can be clearer, and the fingerprint recognition effect can be better.

In the present example arrangement, the thickness a of the insulating layer 11 is approximately greater than 1.0 micrometer and less than or equal to 3.0 micrometers, for example, 1.5 micrometers, 2.2 micrometers, and 2.9 micrometers, and the thickness b of the insulating layer 11 of the recessed area 111 is greater than or equal to 500 angstrom and less than or equal to 1 micrometer, for example, 1000 angstroms, 10,000 angstroms, and 100,000 angstroms. The insulation requirement between the metal light shielding layer 10 and the electrode layer 12 can be satisfied, and also the size of the light leakage port 13 can be reduced.

In the present example arrangement, the orthographic projection of the first spacing area 101 on the metal light shielding layer 10 may be disposed adjacent to the orthographic projection of the second spacing area 121 on the metal light shielding layer 10. That is, the overlapping length of the metal light shielding layer 10 and the electrode layer 12 is reduced.

Example Arrangement 2

Figure 6:
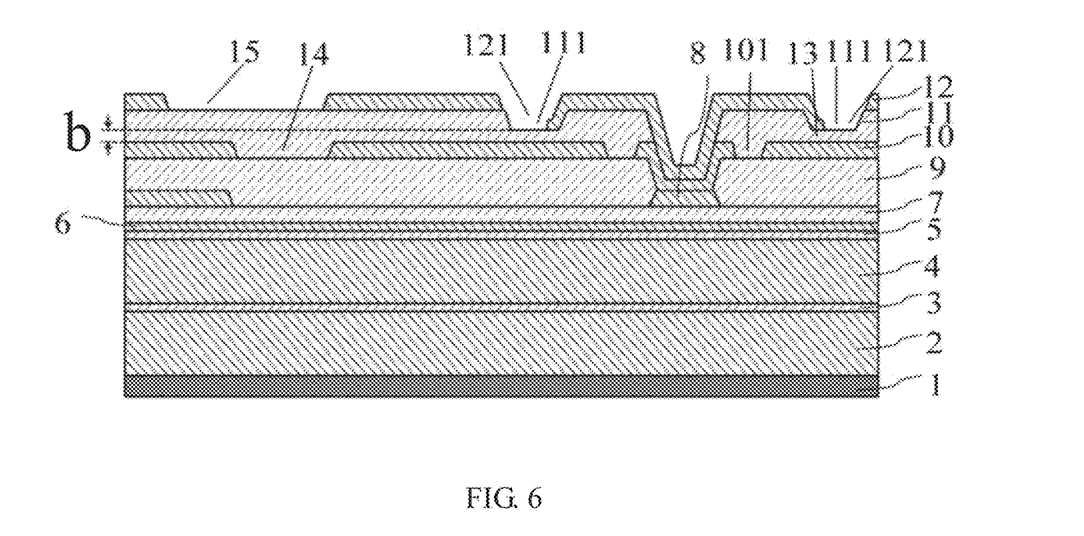
FIG. 6 is a schematic structural diagram of another example arrangement of a display panel having a fingerprint recognition function according to the present disclosure.

Referring to FIG. 6, a schematic structural diagram of another example arrangement of a display panel having a fingerprint recognition function according to the present disclosure is shown. The example arrangement 2 differs from the example arrangement 1 in that the orthographic projection of the recessed area 111 on the metal light shielding layer 10 and the orthographic projection of the second spacing area 121 on the metal light shielding layer 10 are partially overlapped, that is, the position of the recess area 111 is adjacent to the second spacing area 121. The orthographic projection of the recessed area 111 on the metal light shielding layer 10 occupies all of the second area and a part of the spacing area. Moreover, the second spacing area 121 is not disposed on the plane but is disposed in the recessed area 111.

Specifically, the sidewall of the recessed area 111 that is adjacent to the first spacing area 101 (or adjacent to the connecting portion) is located between the sidewall of the first spacing area 101 that is adjacent to the second spacing area 121 (or away from the connecting portion) and the side wall of the second spacing area 121 that is adjacent to the first spacing area 101 (or adjacent to the connecting portion), and the sidewall of the recessed area 111 that is away from the first spacing area 101 (or away from the connecting portion) and the sidewall of the second spacing area 121 that is away from the first spacing area 101 (or away from the connecting portion) are located in the same plane.

In the present example arrangement, the electrode layer 12 is covered on the sidewall of the recessed area 111 adjacent to the first spacing area 101. The electrode layer 12 can block stray light, prevent stray light from being emitted from the recessed area 111 to the first spacing area 101 and finally to the photoelectric sensor.

Of course, it can be understood by those skilled in the art that the electrode layer 12 can also be disposed on the bottom wall of the recessed area 111, that is, the electrode layer 12 extends to cover at least a portion of the bottom wall of the recessed area 111, such that stray light can only be incident from the sidewall of the recessed area 111 that is away from the first spacing area 101 and the remaining part of the bottom wall, and the stray light is incident toward a direction away from the first spacing area 101, therefore, it is more difficult for the stray light to be incident to the first spacing area 101. Thus, the stray light can be further blocked, the incidence of stray light can be reduced, and fingerprint recognition effect can be improved.

Figure 7:
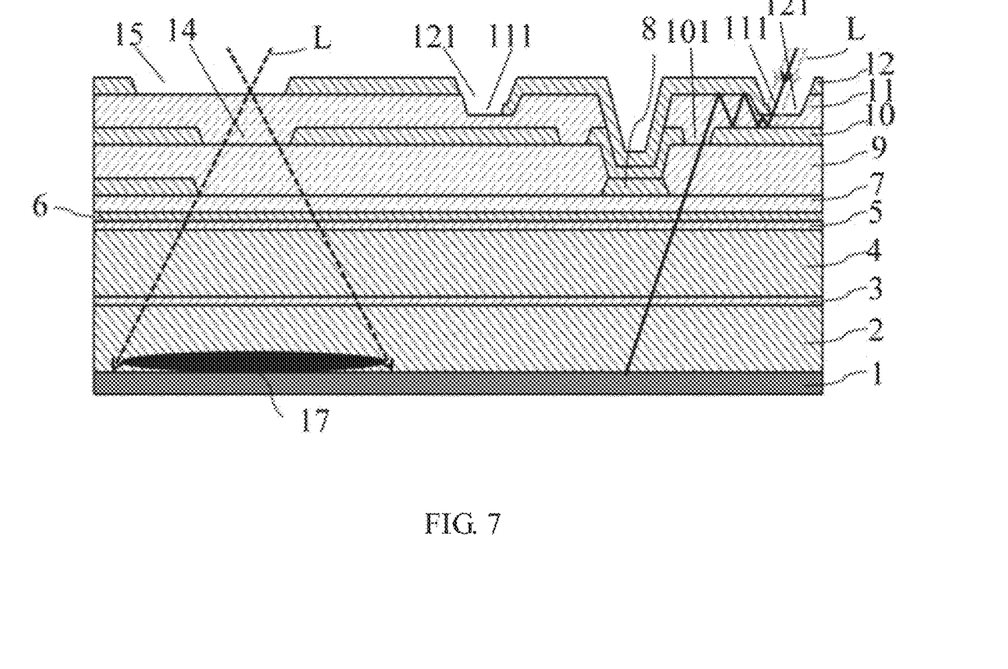
FIG. 7 is a schematic diagram of a light leakage effect of the display panel having the fingerprint recognition function shown in FIG. 6.

Referring to FIG. 7, the light leakage effect diagram of the display panel having the fingerprint recognition function shown in FIG. 6 is shown. Due to the reduced size of the light leakage port 13 between the electrode layer 12 and the metal light shielding layer 10, the stray light passing through the light leakage port 13 can be reduced, such that the stray light passing through the first spacing area 101 can also be reduced, and the fingerprint recognition effect can be effectively improved.

In addition, in other example arrangements of the present disclosure, the orthographic projection of the recessed area 111 on the metal light shielding layer 10 may occupy only the spacing area without occupying the first area and the second area, that is, the recessed area 111 is formed at the spacing between the first spacing area 101 and the second spacing area 121.

Example Arrangement 3

Figure 8:
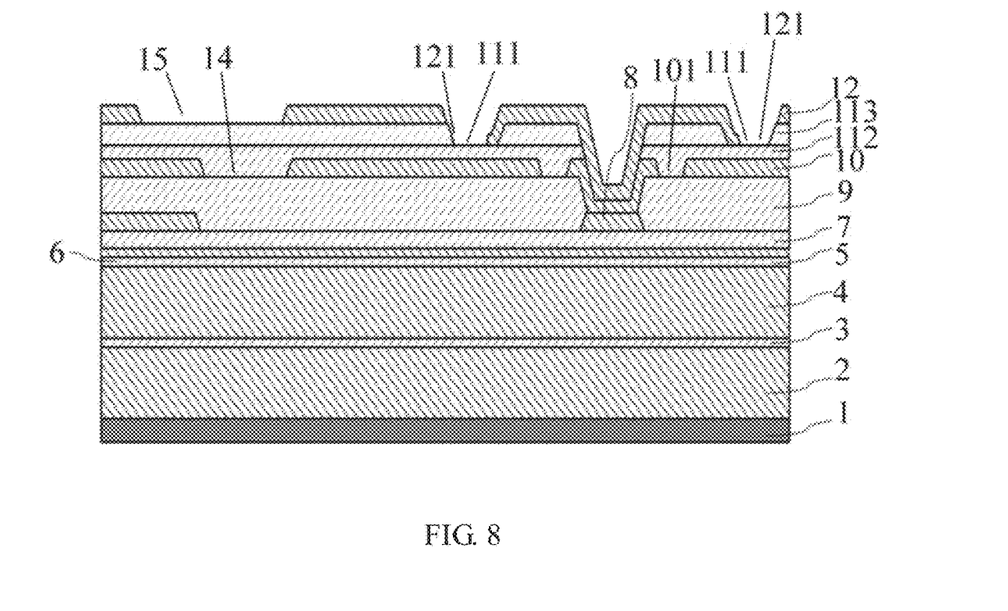
FIG. 8 is a schematic structural diagram of still another example arrangement of a display panel having a fingerprint recognition function according to the present disclosure.

Example arrangement 3 is a further improvement on the example arrangement 2. Referring to FIG. 8, a structural schematic diagram of still another example arrangement of a display panel having a fingerprint recognition function of the present disclosure is shown. The example arrangement 3 differs from the example arrangement 2 in that: the insulating layer 11 may include a first insulating layer 112 and a second insulating layer 113, the first insulating layer 112 is disposed over the metal light shielding layer 10, the second insulating layer 113 is disposed between the first insulating layer 112 and the electrode layer 12, an opening is provided on the second insulating layer 113, no recessed area is not disposed on the first insulating layer 112, and the opening and the first insulating layer 112 together form the recessed area 111.

Of course, the insulating layer 11 in the first arrangement can also be disposed as such. Only the forming process of the insulating layer 11 is different in the example arrangement 1 and in the example arrangement 3, which will not be described in detail here but will be described in detail in the following manufacturing method.

Figure 9:
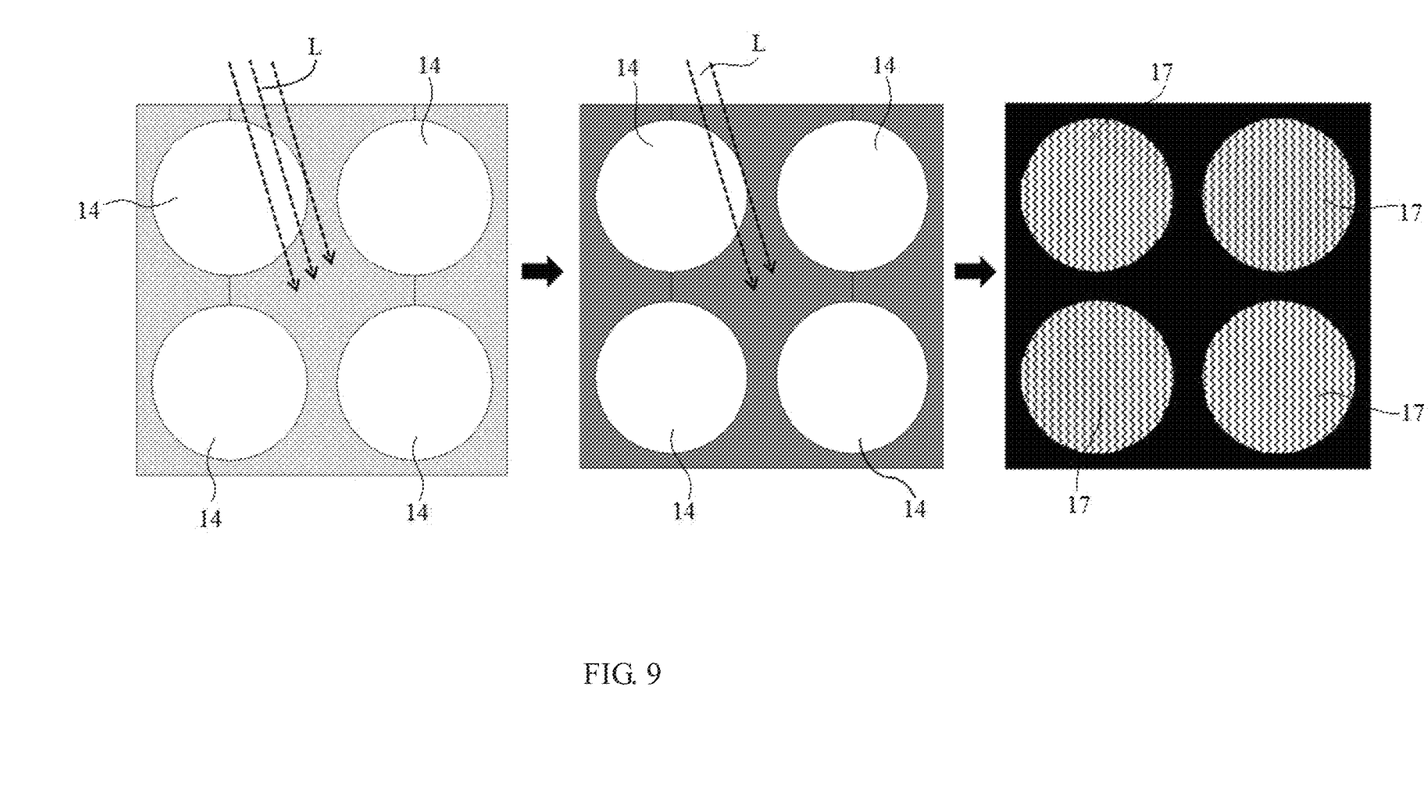
FIG. 9 is a schematic diagram of the effect of stray light on fingerprint image acquisition.

Referring to FIG. 9, in which the schematic diagram of the influence of the stray light on the fingerprint image acquisition is shown, a stray light L is sequentially from strong to weak. When the stray light L is strong, the background image is brighter and the fingerprint image cannot be recognized at all. After the stray light L is slightly weakened, the fingerprint image still cannot be recognized. When there is substantially no stray light, the fingerprint image 17 can be clearly recognized.

Further, the present disclosure further provides a display device, which may include the above-mentioned display panel having a fingerprint recognition function, and the specific structure of the display panel has been described in detail above, and details are not described herein again.

Figure 10:
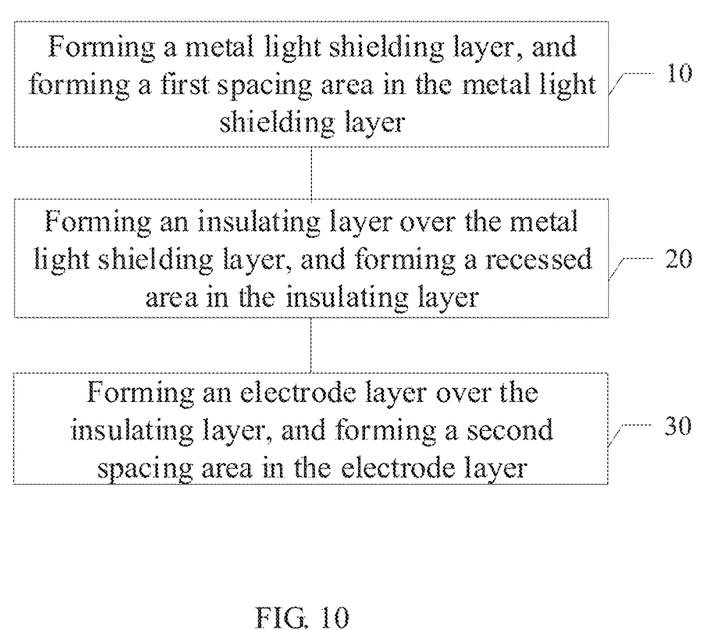
FIG. 10 is a schematic flow chart of an example arrangement of a manufacturing method of a display panel having a fingerprint recognition function according to the present disclosure.

Further, the present disclosure further provides a flow chart corresponding to an example arrangement of a manufacturing method of a display panel having the fingerprint recognition function. Referring to FIG. 10, in which a manufacturing method of the display panel having the fingerprint recognition function is shown, the method can include the following blocks:

In block S10, the metal light shielding layer 10 is formed, and the first spacing area 101 is formed in the metal light shielding layer 10;

In block S20, an insulating layer 11 is formed over the metal light shielding layer 10, and a recessed area 111 is formed in the insulating layer 11;

In block S30, an electrode layer 12 is formed over the insulating layer 11, and a second spacing area 121 is formed in the electrode layer 12.

The orthographic projection of the recessed area 111 on the metal light shielding layer is at least partially located between a first boundary that is an orthographic projection of a sidewall of the first spacing area away from the second spacing area on the metal light shielding layer and a second boundary that is an orthographic projection of a sidewall of the second spacing area away from the first spacing area on the metal light shielding layer, so as to reduce the size of the light leakage port 13 between the metal light shielding layer 10 and the electrode layer 12.

The manufacturing method will be described in detail below.

In block S10, the metal light shielding layer 10 is formed, and the first spacing area 101 is formed in the metal light shielding layer 10.

In the present example arrangement, the metal light shielding layer 10 may be formed by a process such as evaporation, sputtering, or the like, and the first spacing area 101 may be formed by etching on the metal light shielding layer 10. That is, the first spacing area 101 penetrates the upper and lower surfaces of the metal light shielding layer 10.

In block S20, an insulating layer 11 is formed over the metal light shielding layer 10, and a recessed area 111 is formed on the insulating layer 11. In the present arrangement, the recessed area 111 is recessed from the upper surface of the insulating layer 11 toward the lower surface of the insulating layer 11.

There are two example arrangements for block S20.

Example Arrangement 1

The insulating layer 11 can be formed over the metal light shielding layer 10 by a process such as evaporation, sputtering, or the like.

Figure 11:
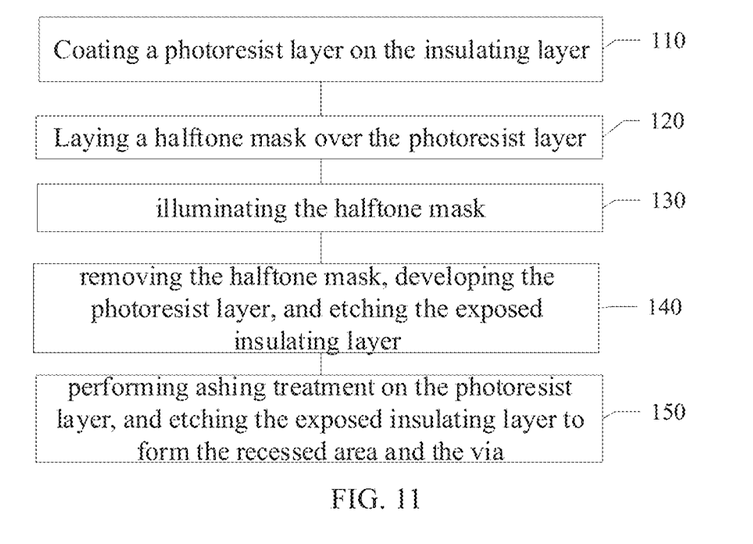
FIG. 11 is a schematic flow chart of an example of forming the recess area and the via in the insulating layer.

First, a photoresist layer is coated on the insulating layer 11; then, a halftone mask is laid over the photoresist layer, with the semi-transmissive area of the halftone mask located in position where the recessed area 111 is to be formed. Secondly, the halftone mask is illuminated. Finally, the halftone mask is removed, and the photoresist layer is developed to remove a part of the photoresist layer in thickness direction at the position where the recessed area 111 is to be formed, and to remove the photoresist layer completely to expose the insulating layer 11 at the position where the via is to be formed. The exposed insulating layer 11 is etched to form a blind hole, and the photoresist layer is ashed to completely remove the photoresist layer where the recessed area 111 is to be formed to expose the insulating layer 11. The insulating layer 11 is etched to form the recessed areas 111 and the via, and the photoresist layer is subjected to a lift-off process to completely remove the photoresist layer.

For example, referring to FIG. 11, which illustrates a flowchart of an example of forming the recess area and the via in the insulating layer. Referring to FIG. 11, the example of forming the recessed area and the via on the insulating layer includes: coating (110) a photoresist layer on the insulating layer; laying (120) a halftone mask over the photoresist layer such that a semi-transmissive area of the halftone mask is located at a position where the recessed area is to be formed; illuminating (130) the halftone mask; removing (140) the halftone mask, developing the photoresist layer to form a step shape on the photoresist layer corresponding to the position where the recessed area is to be formed and expose a first portion of the insulating layer corresponding to a position where a via is to be formed, and etching the first portion to form a blind hole; performing (150) ashing treatment on the photoresist layer to expose a second portion of the insulating layer at the position where the recessed area is to be formed, and etching the first position and the second portion to form the recessed area and the via.

Example Arrangement 2

Figure 12:
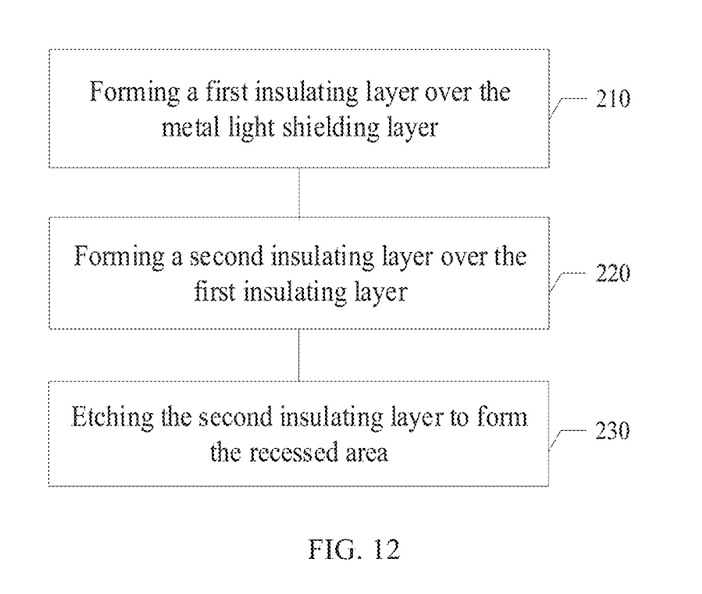
FIG. 12 is a schematic flow chart of an example of forming the recess area in the insulating layer.

First, the first insulating layer 112 may be formed over the metal light shielding layer 10 by a process such as evaporation, sputtering, or the like. Then, the second insulating layer 113 may be formed over the first insulating layer 112 by a process such as evaporation, sputtering, or the like. Finally, the second insulating layer 113 may be etched to form the recessed area 111.

In block S30, the electrode layer 12 is formed over the insulating layer 11, and the second spacing area 121 is formed on the electrode layer 12.

The electrode layer 12 may be formed over the insulating layer 11 by a process such as evaporation, sputtering, or the like, and then the electrode layer 12 may be etched to form the second spacing area 121. That is, the second spacing area 121 penetrates the upper and lower surfaces of the electrode layer 12.

For example, referring to FIG. 12, which illustrates a flowchart of an example of forming the recess area in the insulating layer. Referring to FIG. 12, the example of forming the recessed area on the insulating layer includes: forming (210) a first insulating layer over the metal light shielding layer; forming (220) a second insulating layer over the first insulating layer; and etching (230) the second insulating layer to form the recessed area.

As can be seen from the above technical solutions, the present disclosure can provide at least one of the following improvements.

In the display panel having a fingerprint identification function of the present disclosure, a first spacing area is provided on the metal light shielding layer, a second spacing area is provided on the electrode layer, the second spacing area is disposed offset from the first spacing area; and an insulating layer is disposed between the metal light shielding layer and the electrode layer. The insulating layer is disposed with a recessed area, and the orthographic projection of the recessed area on the metal light shielding layer is located between the orthographic projection of the first spacing area on the metal light shielding layer and the orthographic projection of the second spacing area on the metal light shielding layer to reduce the size of the light leakage port. The thickness of the insulating layer in the recessed area can be reduced, so that the size of the light leakage port for the stray light entering the insulating layer can be reduced. Therefore, the stray light refracted to the first spacing area of the metal light shielding layer by the insulating layer can be reduced, and the stray light incident to the photoelectric sensor can be reduced. As a result, the contrast of the acquired fingerprint can be higher, the obtained fingerprint image can be clearer, and the fingerprint recognition effect can be better.

The features, structures, or characteristics described above may be combined in any suitable manner in one or more arrangements, and the features discussed in the various arrangements are interchangeable, if possible. In the description above, numerous specific details are set forth to provide a thorough understanding of the arrangements of the present disclosure. However, it will be appreciated by those skilled in the art that the technical solutions of the present disclosure may be practiced without one or more of the specific details, or other methods, components, materials, etc., may be employed. In other instances, well-known structures, materials or operations are not shown or described in detail to avoid obscuring aspects of the present disclosure.

The phrase "about" or "around" as used in this specification generally means within 20%, preferably within 10%, and more preferably within 5% of a given value or range. The quantities given herein are approximate quantities, meaning that the meaning of "about", "around", "substantially" and "approximately" may be implied, unless otherwise specified.

Although the relative terms such as "over" and "below" are used in the specification to describe the relative relationship of one component to another component as illustrated, these terms are used in this specification for convenience only, for example, according to the example direction illustrated in the accompanying drawings. It will be understood that if the device as illustrated is flipped upside down, the component described "over" will become the component "below". Other relative terms such as "high", "low", "top" and "bottom" also have similar meanings. When a structure is "over" other structure, it may mean that a structure is integrally formed over other structure, or that a structure is "directly" disposed over other structure, or that a structure is "indirectly" disposed over other structure through another structure.

In the present specification, the terms "a", "an", "the", "said"," "at least one" are used to mean that there are one or more elements/components/etc. The terms "comprising", "including" and "having" are used to mean an open-ended inclusive meaning and are meant to mean that there may be other elements/components, etc. in addition to the listed elements/components/etc. The terms "first", "second" and "third" etc. are used only as markers, without limiting the number of objects.

It should be understood that the present disclosure does not limit its application to the detailed structure and arrangement of the components presented in the specification. The present disclosure can have other arrangements and can be implemented or carried out in various forms. The foregoing variations and modifications are intended to fall within the scope of the present disclosure. It is to be understood that the disclosure disclosed and defined in this specification extends to all alternative combinations of two or more individual features mentioned or apparent in the text and/or in the drawings. All of these different combinations constitute a number of alternative aspects of the present disclosure. The arrangements described in the specification are illustrative of the best mode of the present disclosure, and will enable those skilled in the art to utilize this disclosure.

What is claimed is:

1. A display panel having fingerprint recognition function, comprising:
   a metal light shielding layer disposed with a first spacing area;
   an electrode layer disposed with a second spacing area, wherein the second spacing area is disposed offset from the first spacing area; and
   an insulating layer disposed between the metal light shielding layer and the electrode layer, wherein the insulating layer is disposed with a recessed area;
   wherein an orthographic projection of the recessed area on the metal light shielding layer is at least partially located between a first boundary and a second boundary, and wherein the first boundary is an orthographic projection of a sidewall of the first spacing area away from the second spacing area on the metal light shielding layer, and the second boundary is an orthographic projection of a sidewall of the second spacing area away from the first spacing area on the metal light shielding layer.

2. The display panel having fingerprint recognition function according to claim 1, wherein the orthographic projection of the recessed area on the metal light shielding layer and an orthographic projection of the first spacing area on the metal light shielding layer partially overlap with each other, and the recessed area is covered with the electrode layer.

3. The display panel having fingerprint recognition function according to claim 1, wherein the orthographic projection of the recessed area on the metal light shielding layer and an orthographic projection of the second spacing area on the metal light shielding layer partially overlap with each other, and a sidewall of the recessed area adjacent to the first spacing area is covered with the electrode layer.

4. The display panel having fingerprint recognition function according to claim 1, wherein the orthographic projection of the recessed area on the metal light shielding layer and an orthographic projection of the second spacing area on the metal light shielding layer partially overlap with each other, a sidewall of the recessed area adjacent to the first spacing area is covered with the electrode layer, and the electrode layer extends to cover at least a part of a bottom wall of the recessed area.

5. The display panel having fingerprint recognition function according to claim 1, wherein a thickness of the insulating layer in the recessed area is greater than or equal to 500 angstroms and less than or equal to 1 micrometer.

6. The display panel having fingerprint recognition function according to claim 1, wherein the insulating layer comprises:
   a first insulating layer disposed on the metal light shielding layer;
   a second insulating layer disposed between the first insulating layer and the electrode layer, and disposed with a via to form the recessed area.

7. The display panel having fingerprint recognition function according to claim 1, wherein the orthographic projection of the recessed area on the metal light shielding layer is located within an orthographic projection of the first spacing area on the metal light shielding layer.

8. A display device comprising a display panel having fingerprint recognition function,
   wherein the display panel with fingerprint recognition function comprising:
   a metal light shielding layer disposed with a first spacing area;
   an electrode layer disposed with a second spacing area, wherein the second spacing area is disposed offset from the first spacing area; and
   an insulating layer disposed between the metal light shielding layer and the electrode layer, wherein the insulating layer is disposed with a recessed area;
   wherein an orthographic projection of the recessed area on the metal light shielding layer is at least partially located between a first boundary and a second boundary, and wherein the first boundary is an orthographic projection of a sidewall of the first spacing area away from the second spacing area on the metal light shielding layer, and the second boundary is an orthographic projection of a sidewall of the second spacing area away from the first spacing area on the metal light shielding layer.

9. The display device according to claim 8, wherein the orthographic projection of the recessed area on the metal light shielding layer and an orthographic projection of the first spacing area on the metal light shielding layer partially overlap with each other, and the recessed area is covered with the electrode layer.

10. The display device according to claim 8, wherein the orthographic projection of the recessed area on the metal light shielding layer and an orthographic projection of the second spacing area on the metal light shielding layer partially overlap with each other, and a sidewall of the recessed area adjacent to the first spacing area is covered with the electrode layer.

11. The display device according to claim 8, wherein the orthographic projection of the recessed area on the metal light shielding layer and an orthographic projection of the second spacing area on the metal light shielding layer partially overlap with each other, a sidewall of the recessed area adjacent to the first spacing area is covered with the electrode layer, and the electrode layer extends to cover at least a part of a bottom wall of the recessed area.

12. The display device according to claim 8, wherein a thickness of the insulating layer in the recessed area is greater than or equal to 500 angstroms and less than or equal to 1 micrometer.

13. The display device according to claim 8, wherein the insulating layer comprises:
    a first insulating layer disposed on the metal light shielding layer;
    a second insulating layer disposed between the first insulating layer and the electrode layer, and disposed with a via to form the recessed area.

14. The display device according to claim 8, wherein the orthographic projection of the recessed area on the metal light shielding layer is located within an orthographic projection of the first spacing area on the metal light shielding layer.

15. A manufacturing method of a display panel having fingerprint recognition function, comprising:
    forming a metal light shielding layer, and forming a first spacing area in the metal light shielding layer;
    forming an insulating layer over the metal light shielding layer and forming a recessed area in the insulating layer; and
    forming an electrode layer over the insulating layer and forming a second spacing area in the electrode layer;
    wherein an orthographic projection of the recessed area on the metal light shielding layer is at least partially located between a first boundary and a second boundary,
and wherein the first boundary is an orthographic projection of a sidewall of the first spacing area away from the second spacing area on the metal light shielding layer, and the second boundary is an orthographic projection of a sidewall of the second spacing area away from the first spacing area on the metal light shielding layer.

16. The manufacturing method of the display panel having fingerprint recognition function according to claim 15, wherein the forming the recessed area in the insulating layer comprises:
    coating a photoresist layer on the insulating layer;
    laying a halftone mask over the photoresist layer such that a semi-transmissive area of the halftone mask is located at a position where the recessed area is to be formed;
    illuminating the halftone mask;
    removing the halftone mask, developing the photoresist layer to form a step shape on the photoresist layer corresponding to the position where the recessed area is to be formed and expose a first portion of the insulating layer corresponding to a position where a via is to be formed, and etching the first portion to form a blind hole;
    performing ashing treatment on the photoresist layer to expose a second portion of the insulating layer at the position where the recessed area is to be formed, and etching the first position and the second portion to form the recessed area and the via.

17. The manufacturing method of the display panel having fingerprint recognition function according to claim 15, wherein the forming the insulating layer over the metal light shielding layer and forming the recessed area in the insulating layer, comprises:
    forming a first insulating layer over the metal light shielding layer;
    forming a second insulating layer over the first insulating layer; and
    etching the second insulating layer to form the recessed area.

* * * * *